United States Patent [19]

Landis et al.

[11] Patent Number: 4,585,300
[45] Date of Patent: Apr. 29, 1986

[54] MULTI-EMITTER OPTICAL FIBER DEVICE

[75] Inventors: William C. Landis, Lancaster; Frank S. Pudlo, Leola, both of Pa.

[73] Assignee: RCA Corporation, Princeton, N.J.

[21] Appl. No.: 489,223

[22] Filed: Apr. 27, 1983

[51] Int. Cl.⁴ ................................................ G02B 7/26
[52] U.S. Cl. ............................ 350/96.20; 357/74
[58] Field of Search ........................ 350/96.15, 96.20; 357/74, 75, 80, 84, 17, 19, 30; 250/227

[56] References Cited

U.S. PATENT DOCUMENTS

| 3,581,162 | 5/1971 | Wheatley | 317/234 |
| 4,167,744 | 9/1979 | Nyul | 357/74 |
| 4,216,486 | 8/1980 | Geddes | 357/19 |
| 4,314,740 | 2/1982 | Bickel | 350/96.15 |

FOREIGN PATENT DOCUMENTS 22711  2/1980  Japan ............................... 350/96.20

OTHER PUBLICATIONS

Archey et al., IBM Technical Disclosure Bulletin, vol. 22, No. 12, May 1980, "Low Loss Optical Coupler," pp. 5288-5290.

Primary Examiner—William L. Sikes
Assistant Examiner—Frank González
Attorney, Agent, or Firm—B. E. Morris; D. S. Cohen; H. R. Ball

[57] ABSTRACT

A multi-emitter semiconductor electroluminescent device includes a stud having a mounting block on a surface thereof and a cover extending over the mounting block and secured to the stud. The mounting block has a plurality of surfaces which are angled toward a common point. A separate electroluminescent semiconductor element is mounted on each of the surfaces of the stud and have light emitting surfaces which face toward the common point. The electroluminescent elements are electrically connected to lead wires so that they can be operated either individually or simultaneously. An optical fiber extends through the cover and has one end directly over the common point so that the light emitted from all of the electroluminescent elements will enter the end of the optical fiber and propagate along the fiber.

5 Claims, 3 Drawing Figures

MULTI-EMITTER OPTICAL FIBER DEVICE

BACKGROUND OF THE INVENTION

The present invention relates to a multi-light emitter optical fiber device and more particularly to a device which includes a plurality of semiconductor electroluminescent elements directed into a single optical fiber.

Optical communication systems include an optical fiber having a light source at one end and a light detector at its other end. The device which has come into use as the light source is a semiconductor electroluminescent device, such as a light emitting diode or laser diode. These devices have the advantages of being very small in size and requiring relatively small amounts of power while providing the desired light output. The light emitting semiconductor element is generally mounted in a housing with a length of optical fiber extending from the light emitting surface of the element. The optical fiber extends from the housing so that it can be coupled to the optical fiber which is to carry the light to the light detector.

It is often desirable to have more than one source of light directed into a single optical fiber. One purpose for having more than one light source is for redundancy, so that if one light source becomes inoperative, a second source is still available. Another purpose would be to provide a plurality of separate light signals, either of different frequencies or wavelengths, along a single optical fiber.

The above purposes can be accomplished by connecting the optical fibers extending from a plurality of semiconductor electroluminescent devices to a single optical fiber. However, this method requires a relatively complex coupling for connecting together the various optical fibers.

SUMMARY OF THE INVENTION

A multi-emitter semiconductor electroluminescent device includes a housing having an optical fiber with one end within the housing and extending outside of the housing. A plurality of semiconductor electroluminescent elements are mounted in the housing. Each of the semiconductor electroluminescent elements has a light emitting surface which faces the one end of the optical fiber so that the light emitted from each of the elements is directed to the fiber.

DETAILED DESCRIPTION OF A PREFERRED EMBODIMENT OF THE PRESENT INVENTION

Figure 1:
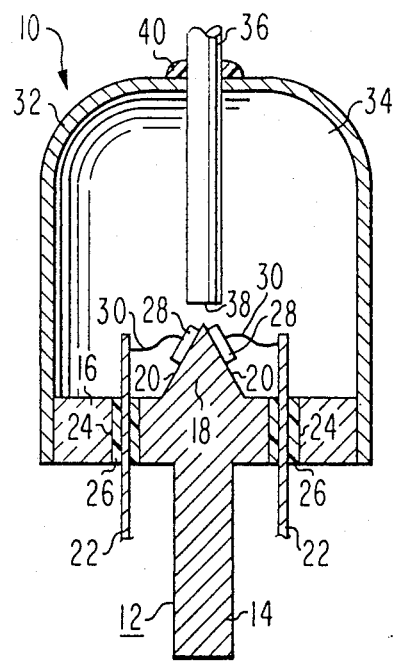
FIG. 1 is a sectional view of a multi-emitter semiconductor electroluminescent device which includes the present invention.

Referring initially to FIG. 1, a form of a semiconductor electroluminescent device which incorporates the present invention is generally designated as 10. The electroluminescent device 10 includes a metal stud 12 having a stem 14 and a circular head 16 on one end of the stem 14. A wedge-shaped metal mounting block 18 is mounted on the center of the top surface of the head 16. The mounting block 18 has side surfaces 20 which are angled toward a common point. The side surfaces 20 of the mounting block 18 are of the same length and are at the same angle with respect to the longitudinal axis of the stem 14. A pair of lead wires 22 extend through separate openings 24 in the head 16 of the stud 12. The lead wires 22 are secured in the openings 24 by bushings 26 of an electrical insulating material so that the lead wires 22 are electrically insulated from the stud 12.

An edge emitting semiconductor electroluminescent element 28 is mounted on each of the side surfaces 20 of the mounting block 18. Each of the edge emitting electroluminescent elements 28 may be either a semiconductor light emitting diode or a laser diode of any well known construction in which the light is emitted from an end surface of the element. For example, the electroluminescent element 28 may be the type disclosed in U.S. Pat. No. 3,974,514 issued to H. Kressel et al. on Aug. 10, 1976, or the type disclosed in U.S. Pat. No. 4,215,319 issued to D. Botez on July 29, 1980. In general, such electroluminescent elements include a body of semiconductor material, generally a group III–V material or compounds of such materials, having regions of opposite conductivity type forming a PN junction therebetween, with the PN junction extending to the light emitting edge surface of the element. The regions of opposite conductivity type extend to opposite surfaces of the element which have metal contacts thereon. One of the contacts is seated on and electrically connected to the mounting block 18 and the other contact is electrically connected to a lead wire 22 by a wire 30. The electroluminescent elements 28 are mounted on the mounting block 18 with their light emitting end surfaces facing away from the head 16 of the stud 12.

A cup-shaped housing 32 surrounds the mounting block 18 and the electroluminescent elements 28 and is secured at its opened end to the head 16 of the stud 12. Thus, the housing 32 and the stud head 16 form an enclosure 34 which contains the electroluminescent elements 28. An optical fiber 36 extends through the housing 32 into the enclosure 34. The optical fiber 36 is positioned with the end surface 38 within the enclosure 34 so that it is over the common point of the side surfaces 20 of the mounting block 18 and the emitting surfaces of the electroluminescent elements 28 and with the longitudinal axis of the fiber 36 being in alignment with the height of the wedge-shaped mounting block 18. The optical fiber 36 may be secured to the housing 32 by means of a suitable cement 40, such as a plastic.

Figure 2:
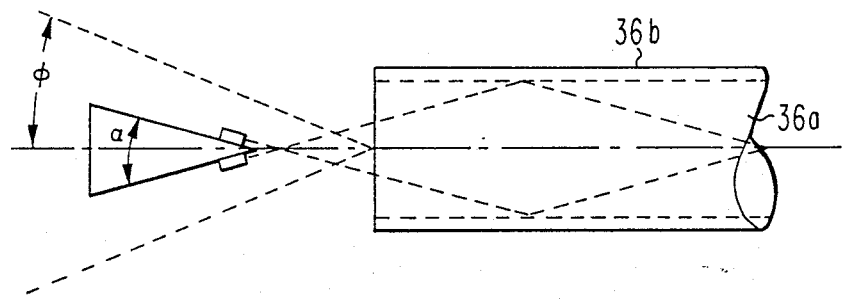
FIG. 2 is a schematic view illustrating the operation of the device of the present invention.

In order for the light emitted from the electroluminescent elements 28 to enter the end of the optical fiber 36 and propagate along the optical fiber, the optimum angle $\alpha$ between the side surfaces 20 of the mounting block 18 should be no greater than $2\phi$, the maximum light acceptance cone angle of the optical fiber, as shown in FIG. 2. The angle $\phi$ can be determined from the following equation:

$$N_a = \sin \phi = \sqrt{n_1^2 - n_2^2}$$

where:
$n_1$ = index refraction of the core 36a of the optical fiber 36
$n_2$ = index refraction of the cladding 36b of the optical fiber 36

$N_a$ = numerical aperture (a measure of the maximum acceptance angle for light propagation in a fiber)

To operate the electroluminescent device 10, the lead wires 22 and stem 14 are connected across a source of DC or pulsed current so that each of the electroluminescent elements 28 can be selectively biased in a manner to cause the electroluminescent element 28 to generate and emit light. The light from each of the electroluminescent elements 28 is directed into the end of the optical fiber 36 so that the light will propagate along the optical fiber. Thus, each of the electroluminescent elements 28 can be turned on individually so that the light from only one will be directed along the fiber or they can be turned on simultaneously so that the light from all will be directed along the optical fiber 36.

Although the electroluminescent device 10 is shown as having two electroluminescent elements 28, it can have more than two such elements, if desired. If the electroluminescent device 10 has more than two electroluminescent elements 28, the mounting block 18 is made in the form of a pyramid having a number of side surfaces 20 equal to the number of electroluminescent elements 28 to be mounted thereon. Each of the side surfaces 20 is angled in accordance with the equation stated above so that the light emitted from the electroluminescent element 28 mounted thereon is directed within the acceptance angle for the optical fiber 36 and will therefore enter and propagate along the optical fiber 36. Thus, there is provided by the present invention, an electroluminescent device having a plurality of electroluminescent elements, each of which will direct its light into a single optical fiber. The electroluminescent elements can be operated individually or simultaneously.

Figure 3:
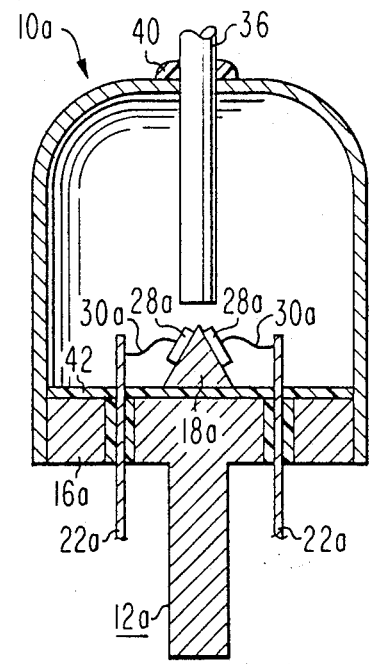
FIG. 3 is a sectional view of a modification of a multi-emitter semiconductor electroluminescent device which includes the present invention.

Referring to FIG. 3, there is shown a modification of the electroluminescent device, generally designated 10a, similar to the electroluminescent device 10 shown in FIG. 1 except that a layer 42 of an electrical insulating material is provided between the mounting block 18a and the head 16a of the stud 12a. The electroluminescent elements 28a are mounted on the mounting block 18a so that they are electrically in series. The electroluminescent elements 28a are connected to the lead wires 22a by wires 30a so that the electroluminescent elements 28a are electrically connected in series between the lead wires 22a through the mounting block 18a and will thereby operate simultaneously to direct light into the optical fiber 36.

We claim:

1. A multi-emitter semiconductor electroluminescent device, comprising:
    an optical fiber;
    a housing having one end of said optical fiber therein, and including a mounting block having a plurality of sides angled toward a common point in which the optimum angle of each of said sides with respect to the longitudinal axis of said optical fiber is no greater than ½ the acceptance angle of said optical fiber; and
    a plurality of semiconductor electroluminescent elements mounted in the housing, with a separate element being mounted on each of said sides such that the light emitted therefrom is directed into the end of the fiber, within the housing.

2. An electroluminescent device in accordance with claim 1 in which the housing includes a stud with the mounting block being on a surface of the stud and a cover extending over the mounting block and secured to the stud.

3. An electroluminescent device in accordance with claim 2 in which the optical fiber extends through and is secured to the cover of the housing.

4. An electroluminescent device in accordance with claim 1 in which the mounting block is electrically connected to a terminal of the housing and each of the electroluminescent elements is electrically connected at one side to the mounting block and at the other side to a separate lead wire so that the electroluminescent elements can be operated either separately or simultaneously.

5. An electroluminescent device in accordance with claim 1 including means electrically insulating the mounting block from the housing and the electroluminescent elements are electrically connected in series through the mounting block.

* * * * *